US009146368B2

(12) United States Patent
Chan et al.

(10) Patent No.: US 9,146,368 B2
(45) Date of Patent: Sep. 29, 2015

(54) METHODS AND SYSTEMS FOR DISSIPATING HEAT IN OPTICAL COMMUNICATIONS MODULES

(75) Inventors: Seng-Kum Chan, Santa Clara, CA (US); David J. K. Meadowcroft, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 292 days.

(21) Appl. No.: 13/600,334

(22) Filed: Aug. 31, 2012

(65) Prior Publication Data

US 2014/0063743 A1    Mar. 6, 2014

(51) Int. Cl.
*G02B 6/42* (2006.01)
*H05K 1/02* (2006.01)
*H05K 1/00* (2006.01)
*H05K 7/20* (2006.01)

(52) U.S. Cl.
CPC .............. *G02B 6/428* (2013.01); *G02B 6/4269* (2013.01); *H05K 1/0209* (2013.01); *H05K 7/2039* (2013.01); *H05K 7/2049* (2013.01); *H05K 2201/10106* (2013.01); *H05K 2201/10121* (2013.01); *H05K 2201/10174* (2013.01)

(58) Field of Classification Search
CPC .... G02B 6/428; G02B 6/4269; H05K 1/0209; H05K 2201/10106; H05K 2201/10121; H05K 2201/10174; H05K 7/2039
USPC ........................ 361/679.46–679.54, 688–723; 165/80.1–80.3; 257/712–713, 257/717–722; 174/15.1, 16.1–16.3, 174/547–548; 372/34, 36
See application file for complete search history.

(56) References Cited

U.S. PATENT DOCUMENTS

| | | | |
|---|---|---|---|
| 6,773,532 B2 | 8/2004 | Wolf et al. | |
| 6,859,470 B2 | 2/2005 | Fu et al. | |
| 7,331,720 B1 * | 2/2008 | McColloch | 385/88 |
| 7,543,994 B2 * | 6/2009 | McColloch | 385/89 |
| 8,041,160 B2 * | 10/2011 | Meadowcroft et al. | 385/14 |
| 8,280,203 B2 * | 10/2012 | Meadowcroft et al. | 385/14 |
| 8,559,824 B2 * | 10/2013 | McColloch et al. | 398/135 |
| 8,563,918 B2 * | 10/2013 | McColloch | 250/239 |
| 2008/0267234 A1 | 10/2008 | Scofet et al. | |
| 2009/0154513 A1 | 6/2009 | Shin | |
| 2010/0266236 A1 * | 10/2010 | Meadowcroft et al. | 385/14 |
| 2011/0008005 A1 * | 1/2011 | Meadowcroft et al. | 385/88 |
| 2011/0206326 A1 * | 8/2011 | McColloch | 385/88 |
| 2014/0147127 A1 * | 5/2014 | McColloch et al. | 398/135 |

OTHER PUBLICATIONS

P.Z.F. Shi, A.C.W. Lu, S.C.K. Wong, Y.M.M Tan, E. Tan, R. Tan, Thermal Modelling of Optoelectronic Modules p. 71-77, United States.

* cited by examiner

*Primary Examiner* — Zachary M Pape

(57) ABSTRACT

Heat dissipation resources are allocated in an optical communications module based on the sensitivity of electrical and optoelectronic components of the module to temperature. Components that have a higher sensitivity to temperature are allocated a greater proportion of available heat dissipation resources than components that have a lower sensitivity to temperature. In addition, heat dissipation resources that are allocated to components that have different sensitivities to temperature are thermally decoupled from one another.

20 Claims, 13 Drawing Sheets

METHODS AND SYSTEMS FOR DISSIPATING HEAT IN OPTICAL COMMUNICATIONS MODULES

TECHNICAL FIELD OF THE INVENTION

The invention relates to optical communications modules. More particularly, the invention relates to heat dissipation systems and methods used in optical communications modules such as parallel optical transmitter, receiver and transceiver modules.

BACKGROUND OF THE INVENTION

A variety of parallel optical communications modules exist for simultaneously transmitting and/or receiving multiple optical data signals over multiple respective optical data channels. Parallel optical transmitters have multiple optical transmit channels for transmitting multiple respective optical data signals simultaneously over multiple respective optical waveguides (e.g., optical fibers). Parallel optical receivers have multiple optical receive channels for receiving multiple respective optical data signals simultaneously over multiple respective optical waveguides. Parallel optical transceivers have multiple optical transmit and receive channels for transmitting and receiving multiple respective optical transmit and receive data signals simultaneously over multiple respective transmit and receive optical waveguides.

For each of these different types of parallel optical communications modules, a variety of designs and configurations exist. A typical layout for a parallel optical communications module includes a circuit board, such as a printed circuit board (PCB), a ball grid array (BGA), or the like, on which various electrical components and optoelectronic components (i.e., laser diodes and/or photodiodes) are mounted. In the case of a parallel optical transmitter, laser diodes and one or more laser diode driver integrated circuits (ICs) are mounted on the circuit board. The circuit board has electrical conductors running through it (i.e., electrical traces and vias) and electrical contact pads on it. The electrical contact pads of the laser diode driver IC(s) are electrically connected to the electrical conductors of the circuit board. One or more other electrical components, such as a controller IC, for example, are typically also mounted on and electrically connected to the circuit board.

Similar configurations are used for parallel optical receivers, except that the circuit board of the parallel optical receiver has a plurality of photodiodes instead of laser diodes mounted on it and a receiver IC instead of a laser diode driver IC mounted on it. Parallel optical transceivers typically have laser diodes, photodiodes, one or more laser diode driver ICs, and a receiver IC mounted on the circuit board, although one or more of these devices may be integrated into the same IC to reduce part count and to provide other benefits.

The circuit board typically has one or more heat sink devices mounted on the upper surface thereof. The heat sink devices are typically thermal pads, but can have various shapes. The electrical and optoelectronic components are typically attached by a thermally conductive material to these heat sink devices to enable heat generated by them to pass into and be dissipated by the heat sink devices. Heat sink devices all have the same general purpose of receiving heat generated by the respective components and absorbing and/or spreading out the heat to move it away from the components. Heat generated by the components can detrimentally affect the performance of the parallel optical communications module.

There is an ever-increasing need to decrease the size and to increase the number of channels of parallel optical communications modules. In order to meet these needs, heat dissipation devices need to be efficient in terms of space utilization, but also highly effective at dissipating heat. As the number of channels increases, the number of components that generate heat also increases. At the same time, implementing adequate heat dissipation solutions becomes even more difficult due to the higher density of components in a smaller area.

Accordingly, a need exists for methods and systems that provide improvements in heat dissipation and that are efficient in terms of space utilization.

SUMMARY OF THE INVENTION

The invention provides methods and systems for dissipating heat in an optical communications module. The module comprises a circuit board having a metal pattern thereon, a heat dissipation layer disposed over portions of the metal pattern, at least a first optoelectronic component disposed on a first portion of the heat dissipation layer, and at least a first IC disposed on a second portion of the heat dissipation layer. The heat dissipation layer comprises a layer of electrically-conductive and thermally-conductive material. The first and second portions of the heat dissipation layer are thermally decoupled from one another. At least some heat that is generated by the first optoelectronic component flows into the first portion of the heat dissipation layer. At least some heat that is generated by the first IC flows into the second portion of the heat dissipation layer.

The method comprises:

for multiple active components of an optical communications module, determining a sensitivity of each active component to temperature;

developing a heat dissipation strategy for the module that allocates available heat dissipation resources among the active components based on the temperature sensitivities of the active components; and designing a heat dissipation system for the module that implements the heat dissipation strategy.

These and other features and advantages of the invention will become apparent from the following description, drawings and claims.

DETAILED DESCRIPTION OF AN ILLUSTRATIVE EMBODIMENT

Figure 1:
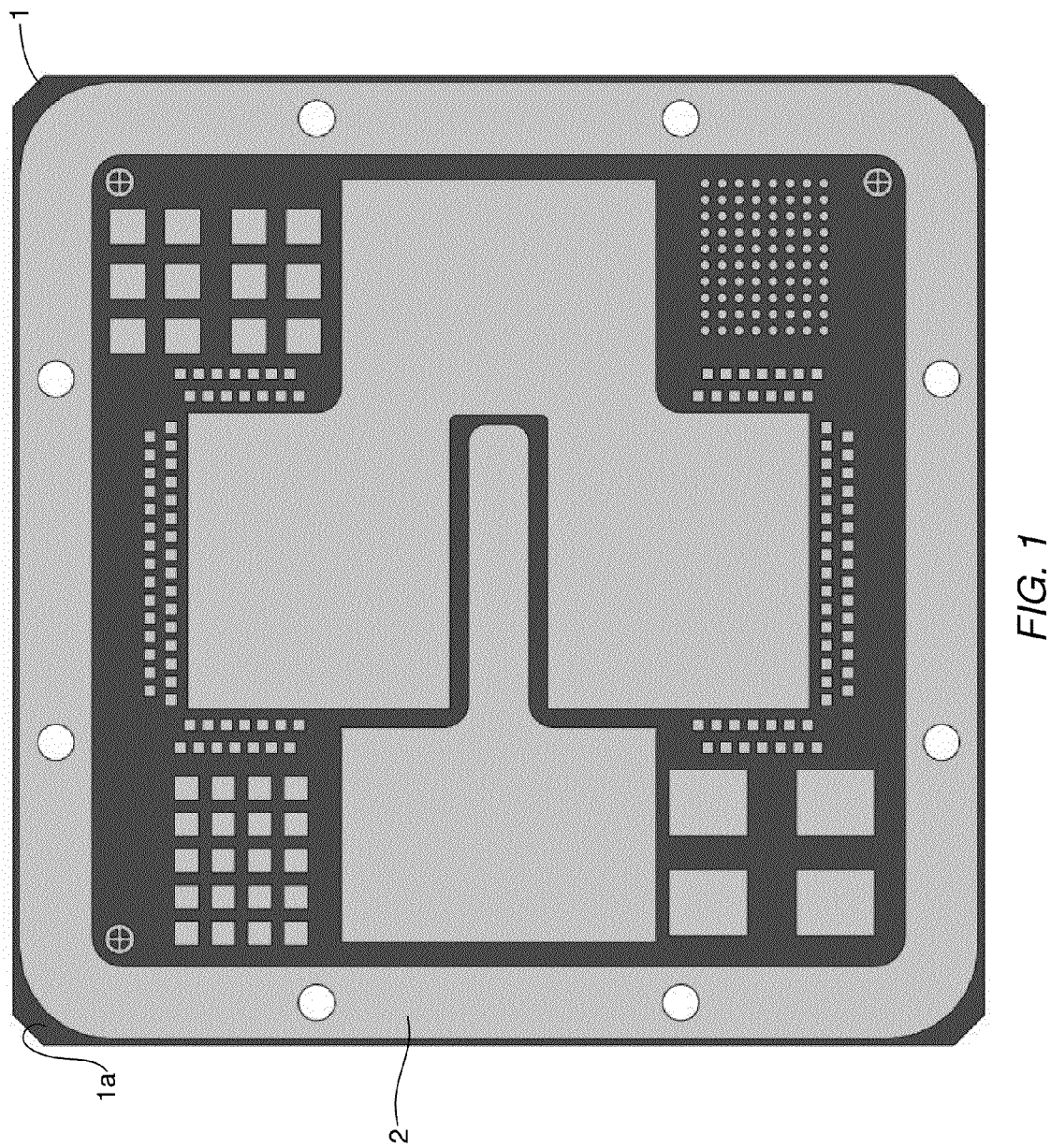
FIG. 1 illustrates a top plan view of a PCB having a metal pattern disposed on an upper surface thereof.

In accordance with the invention, heat dissipation resources are allocated in an optical communications module based on the sensitivity of electrical and optoelectronic components of the module to temperature. Components that have a higher sensitivity to temperature are allocated a greater proportion of available heat dissipation resources than components that have a lower sensitivity to temperature. In addition, heat dissipation resources that are allocated to components that have different sensitivities to temperature are thermally decoupled from one another.

Active electrical and optoelectronic components of optical communications modules are used to manipulate signals and data. They include the laser diodes (e.g., vertical cavity surface emitting laser diodes (VCSELs)), the laser diode driver ICs, microprocessor ICs, microcontroller ICs, clock circuits, and other components. The active components consume relatively large amounts of electrical power. Increases in data rate and increases in the complexity of such components have resulted in even greater amounts of power being consumed by these components. This increase in power consumption is generally accompanied by an increase in the temperature of the components. As indicated above, the density of these components within optical communications modules is also increasing, i.e., the components are being placed closer and closer together within the module. All of these factors can lead to thermal crosstalk occurring, which can be detrimental to components. Thus, proper thermal management is now of paramount importance.

Some of the active components are very sensitive to temperature. Active components that operate continuously at higher-than-normal temperatures may have reduced operational life or increased potential of failure. Thus, it is imperative that adequate heat dissipation systems and methods be used to keep these thermally-sensitive components operating below certain temperature limits. However, thermal sensitivity is not the same for all of the components. Some components can operate continuously at higher temperatures than others. In accordance with methods of the invention, this difference in sensitivity is used to develop heat sinking, or dissipation, strategy, and then a heat dissipation system is developed that implements that strategy. Illustrative, or exemplary, embodiments will now be described with reference to the figures, in which like reference numerals represent like components, elements or features.

Figure 2:
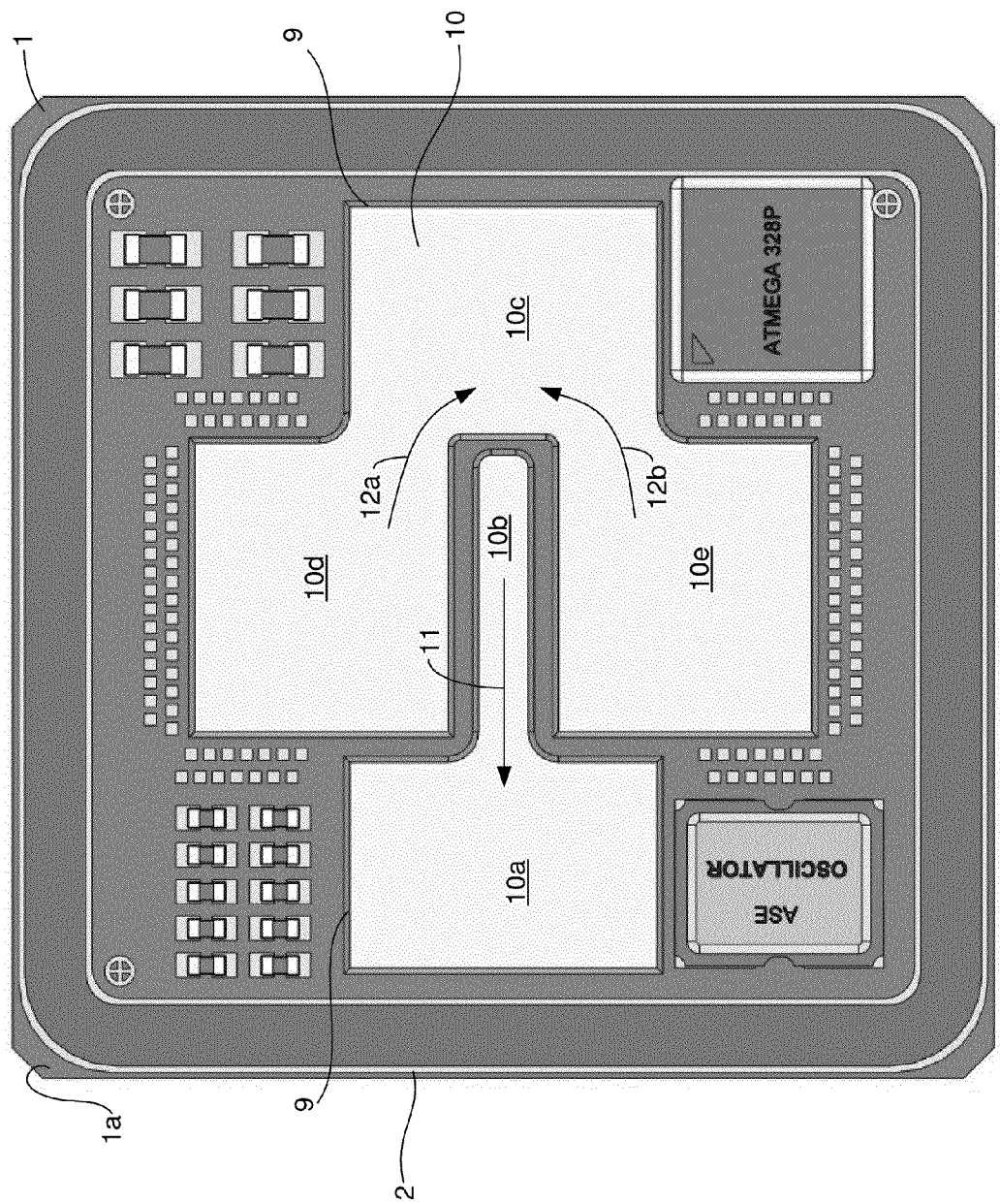
FIG. 2 illustrates a top plan view of the PCB shown in FIG. 1 after an electrically-conductive and thermally-conductive heat dissipation layer has been secured to portions of the metal pattern via an electrically and thermally conductive adhesive material.
Figure 3:
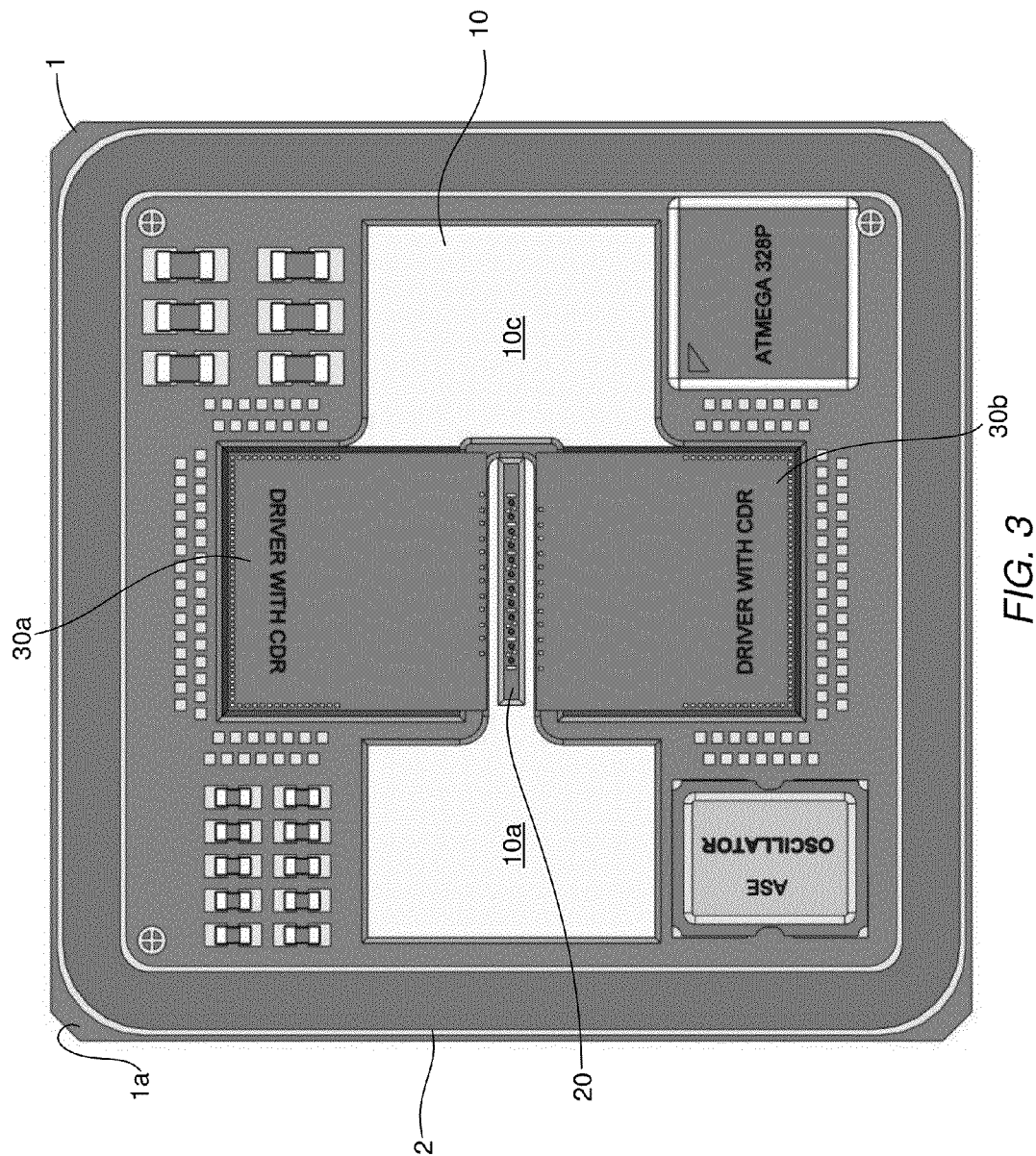
FIG. 3 illustrates a top plan view of the PCB having the heat dissipation layer shown in FIG. 2 secured thereto and having a VCSEL array and first and second VCSEL driver ICs secured to the heat dissipation layer.

FIG. 1 illustrates a top plan view of a PCB 1 having a metal pattern 2 disposed on an upper surface 1a of the PCB 1. The metal pattern 2 is typically formed in a thin copper layer, although other electrically-conductive metals may be used for this purpose. In accordance with this illustrative embodiment, a heat dissipation strategy has been developed that provides separate heat dissipation paths for a VCSEL array (not shown) and for two VCSEL driver ICs (not shown). FIG. 2 illustrates a top plan view of the PCB 1 shown in FIG. 1 after an electrically-conductive and thermally-conductive heat dissipation layer 10 has been secured to portions of the metal pattern 2 via an electrically and thermally conductive adhesive material 9. The heat dissipation layer 10 is typically a metal layer, such as a layer of copper, for example, that is thicker than the layer in which the metal pattern 2 is formed. However, other electrically-conductive and thermally-conductive materials may be used for this purpose. FIG. 3 illustrates a top plan view of a PCB 1 having the heat dissipation layer 10 shown in FIG. 2 secured thereto and having a VCSEL array 20 and first and second VCSEL driver ICs 30a and 30b secured to the heat dissipation layer 10. The heat dissipation strategy and the heat dissipation system that implements that strategy will now be described with reference to FIGS. 1, 2 and 3.

The VCSEL array 20 (FIG. 3) and the VCSEL driver ICs 30a and 30b (FIG. 3) are relatively sensitive to temperature. In accordance with this embodiment, the heat dissipation strategy is to use available heat dissipation resources to provide a heat dissipation system that dissipates heat from the VCSEL array 20 (FIG. 3) and from the VCSEL driver ICs 30a and 30b (FIG. 3). Although the VCSEL array 20 (FIG. 3) is more sensitive to temperature than the VCSEL driver ICs 30a and 30b (FIG. 3), in accordance with this strategy, it has been determined that there are sufficient heat dissipation resources available to be allocated for use by all of these components. The heat dissipation strategy also involves decoupling the thermal path that is used for moving heat away from the VCSEL array 20 (FIG. 3) from the thermal paths that are used for moving heat away from the VCSEL driver ICs 30a and 30b (FIG. 3), as will be described below in more detail with reference to FIG. 2.

The portion 10a (FIG. 2) of the heat dissipation layer 10 is used for dissipating heat generated by the VCSEL array 20. The portion 10b (FIG. 2) of the heat dissipation layer 10 acts as a heat dissipation pad for placement of the VCSEL array 20 (FIG. 3) on the PCB 1. Heat generated by the VCSEL array 20 (FIG. 3) is first transferred downwards into portion 10b (FIG. 2) of the heat dissipation layer 10 and then travels along a thermal path represented by arrow 11 (FIG. 2) into portion 10a (FIG. 2) of the heat dissipation layer 10. As will be described below with reference to FIG. 7, other components of the heat dissipation system are then used to transfer the heat from portion 10a (FIG. 2) of the heat dissipation layer 10 out of the module (not shown).

The portion 10c (FIGS. 2 and 3) of the heat dissipation layer 10 is used for dissipating heat generated by the VCSEL driver ICs 30a and 30b (FIG. 3). The portions 10d and 10e (FIG. 2) of the heat dissipation layer 10 act as heat dissipation pads for placement of the VCSEL driver ICs 30a and 30b (FIG. 3) on the PCB 1. Heat generated by the VCSEL driver ICs 30a and 30b (FIG. 3) is first transferred downwards into portions 10d and 10e (FIG. 2) of the heat dissipation layer 10 and then travels along thermal paths represented by arrows 12a and 12b (FIG. 2), respectively, into portion 10c of the heat dissipation layer 10. As will be described below with reference to FIG. 7, other components of the heat dissipation system are then used to transfer the heat from portion 10c (FIGS. 2 and 3) of the heat dissipation layer 10 out of the module (not shown).

It can be seen in FIG. 2 that the thermal path 11 that is used for transferring heat away from the VCSEL array 20 (FIG. 3) is separate from the thermal paths 12a and 12b (FIG. 2) that are used for transferring heat away from the VCSEL driver arrays 30a and 30b (FIG. 3). Keeping these thermal paths separate thermally decouples them, which helps prevent thermal crosstalk from occurring between the VCSEL array 20 (FIG. 3) and the VCSEL driver ICs 30a and 30b (FIG. 3). Preventing thermal crosstalk from occurring prevents heat that is generated by one component from causing an unacceptable temperature rise in one or more of the other components. For example, in accordance with this illustrative embodiment, keeping the thermal path 11 (FIG. 2) separate from the thermal paths 12a and 12b (FIG. 2) prevents heat generated by the VCSEL driver ICs 30a and 30b (FIG. 3) from detrimentally affecting the operations and the life expectancy of the VCSEL array 20 (FIG. 3). The term "thermally decoupled," as that term is used herein in connection with thermal paths or portions of the heat dissipation layer, means that very little heat, or ideally no heat, is transferred between the paths or portions.

Figure 4:
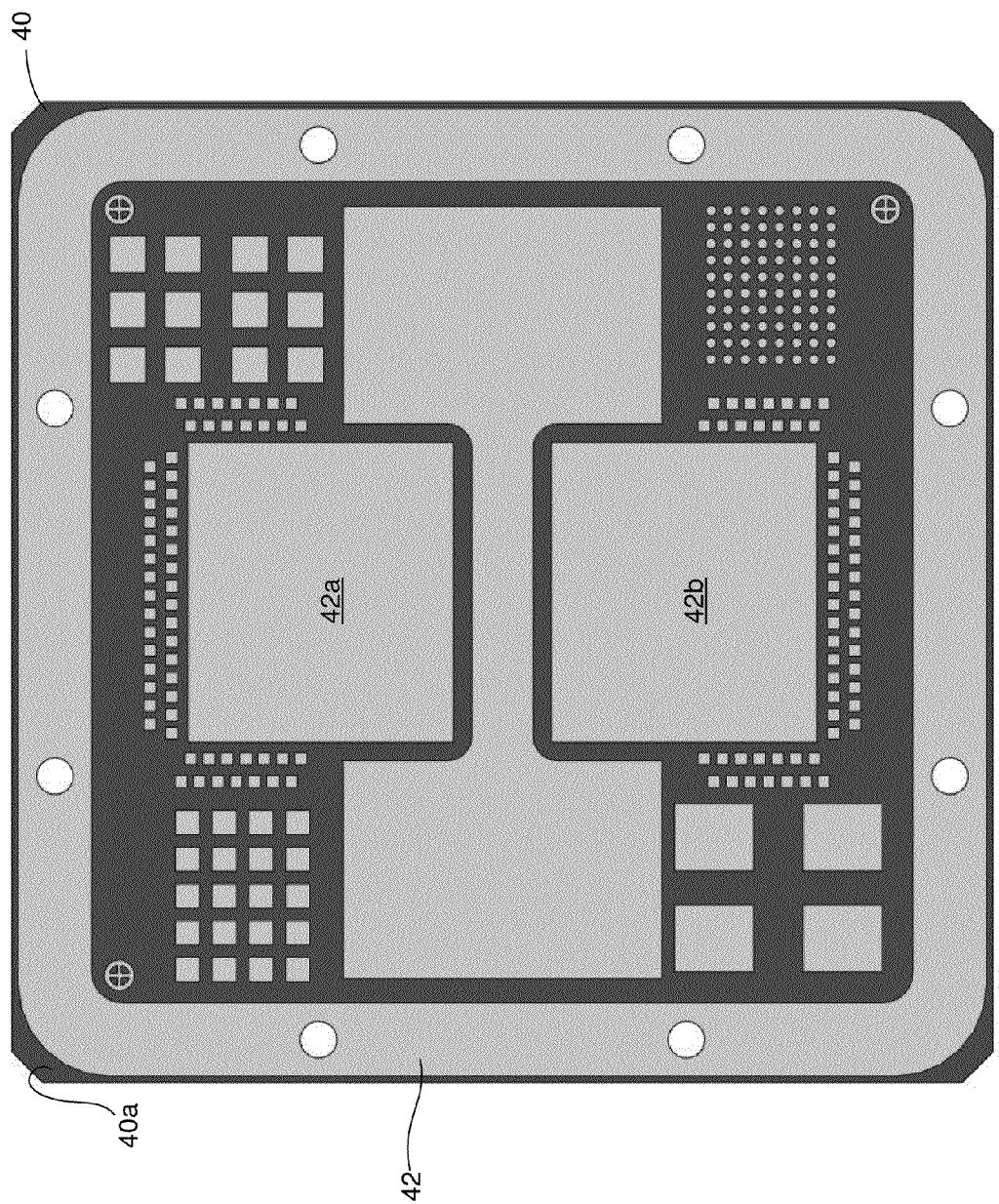
FIG. 4 illustrates a top plan view of a PCB having a thin metal pattern disposed on its upper surface.
Figure 5:
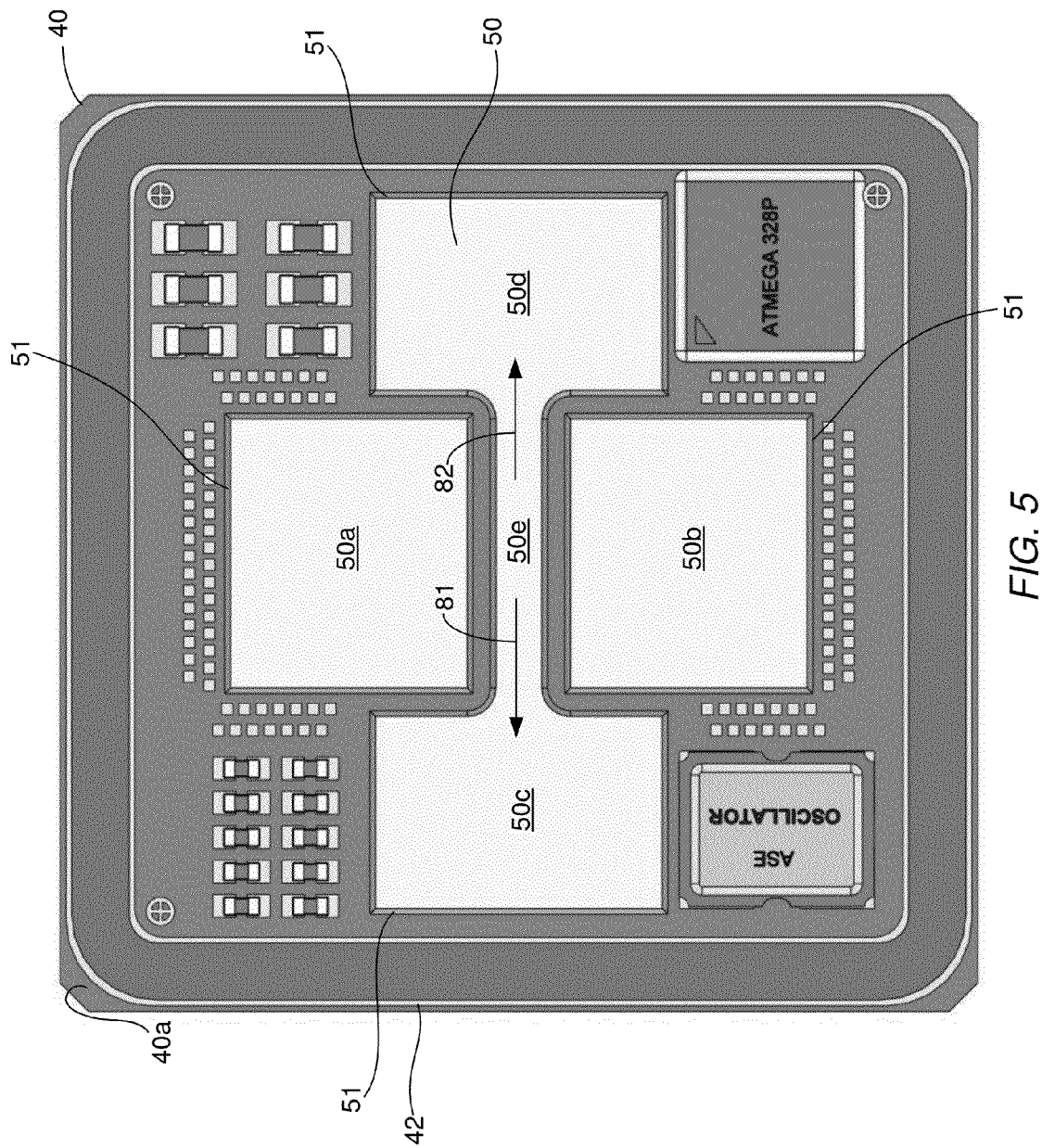
FIG. 5 illustrates a top plan view of the PCB shown in FIG. 4 after an electrically-conductive and thermally-conductive heat dissipation layer has been secured to particular portions of the metal pattern via an electrically and thermally conductive adhesive material.
Figure 6:
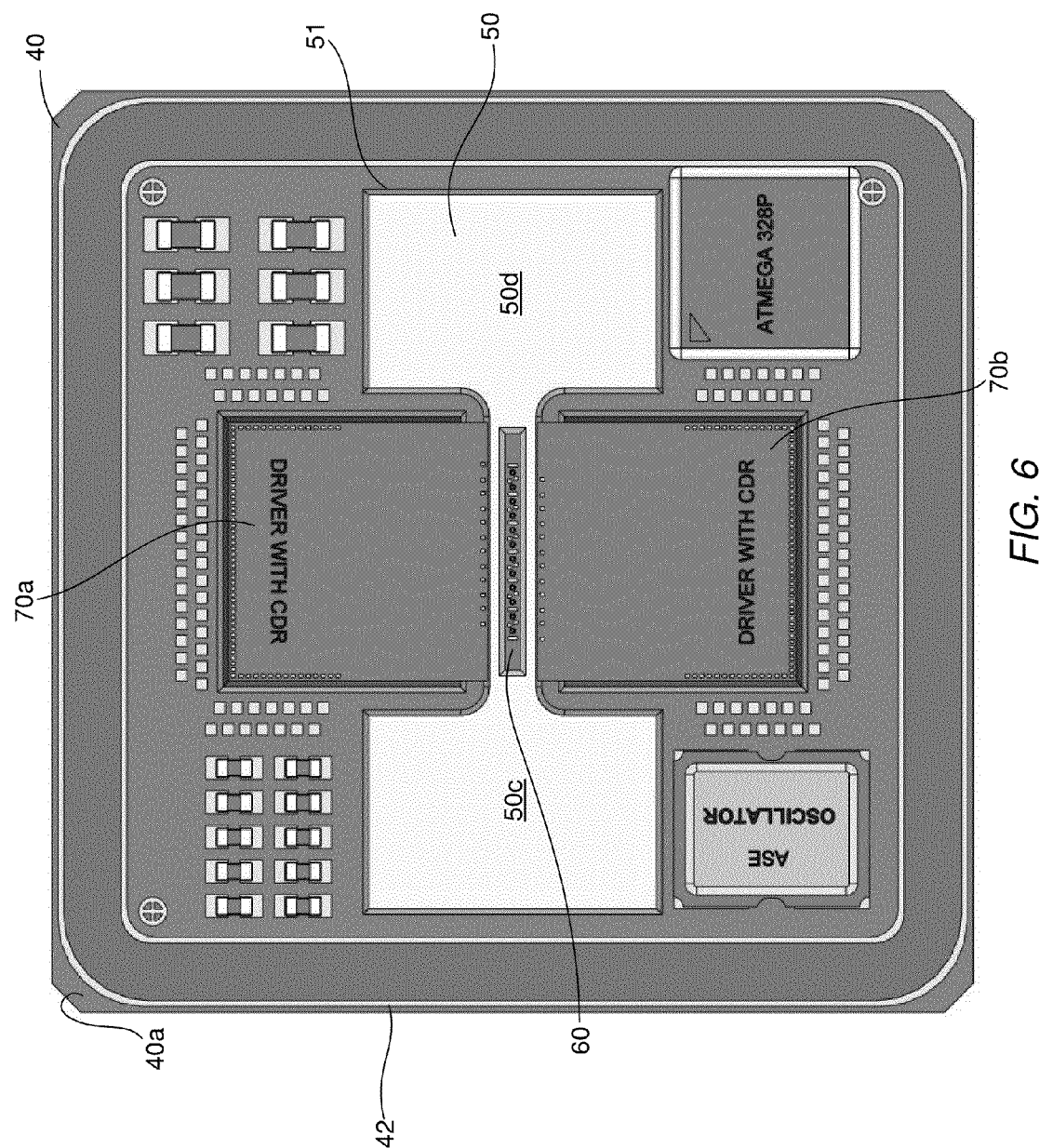
FIG. 6 illustrates a top plan view of the PCB shown in FIG. 5 with a VCSEL array and first and second VCSEL driver ICs secured to portions of the heat dissipation layer.

FIG. 4 illustrates a top plan view of a PCB 40 having a thin metal (e.g., copper) pattern 42 disposed on an upper surface 40a of the PCB 40. The metal pattern 42 (FIG. 4) is typically formed in a thin copper layer. FIG. 5 illustrates a top plan view of the PCB 40 shown in FIG. 4 after an electrically-conductive and thermally-conductive heat dissipation layer 50 has been secured to particular portions of the metal pattern 42 via an electrically and thermally conductive adhesive material 51. FIG. 6 illustrates a top plan view of the PCB 40 shown in FIG. 5 with a VCSEL array 60 and first and second VCSEL driver ICs 70a and 70b secured to portions of the heat dissipation layer 50. The heat dissipation strategy in accordance with this illustrative embodiment will now be described with reference to FIGS. 4, 5 and 6.

In accordance with this illustrative embodiment, the heat dissipation strategy is, in part, to use almost all available heat dissipation resources for the VCSEL array 60 (FIG. 6) and very little of the available heat dissipation resources for the VCSEL driver ICs 70a and 70b (FIG. 6). The VCSEL driver ICs 70a and 70b (FIG. 6) are simply mounted on pads 50a and 50b (FIG. 5), respectively, of the heat dissipation layer 50 that have been secured to pads 42a and 42b (FIG. 4) of the metal pattern 42. Thus, no additional surface area on the PCB 40 is used for dissipating heat produced by the VCSEL driver ICs 70a and 70b (FIG. 6). Because the VCSEL array 60 (FIG. 6) is more sensitive to temperature than the VCSEL driver ICs 70a and 70b (FIG. 6), almost all available heat dissipation resources are used to dissipate heat produced by the VCSEL array 60 (FIG. 6). In addition, the thermal paths that are used for moving heat away from the VCSEL array 60 (FIG. 6) are thermally decoupled from the heat dissipation pads 50a and 50b (FIG. 5) on which the VCSEL driver ICs 70a and 70b (FIG. 6), respectively, are mounted.

The portions 50c and 50d (FIGS. 5 and 6) of the heat dissipation layer 50 are used for dissipating heat generated by the VCSEL array 60 (FIG. 6). Heat generated by the VCSEL array 60 (FIG. 6) is first transferred downwards into portion 50e (FIG. 5) and then travels along two thermal paths represented by arrows 81 and 82 (FIG. 5) into portions 50c and 50d (FIGS. 5 and 6). As will be described below with reference to FIG. 8, other components of the heat dissipation system are then used to transfer the heat from portions 50c and 50d (FIGS. 5 and 6) of the heat dissipation layer 50 out of the module (not shown).

The heat dissipation pads 50a and 50b (FIGS. 5 and 6) of the heat dissipation layer 50 (FIG. 4) receive heat generated by the VCSEL driver ICs 70a and 70b (FIG. 6), respectively, and transfer it into the metal pads 42a and 42b (FIG. 2), respectively, of the metal pattern 42 (FIG. 4). This allows at least a substantial portion of the heat that is generated by the VCSEL driver ICs 70a and 70b (FIG. 6) to be dissipated through the bottom of the PCB 40. In many cases, this will be sufficient and will allow most of the available heat dissipation resources to be used for dissipating heat generated by the VCSEL array 60 (FIG. 6), which is the most temperature-sensitive component of the module. In addition, decoupling the thermal paths 81 and 82 (FIG. 5) that are used to transfer heat away from the VCSEL array 60 (FIG. 6) from the thermal paths (pads 50a and 50b in FIG. 5) that are used to transfer heat away from the VCSEL driver ICs 70a and 70b (FIG. 6) ensures that heat generated by the VCSEL driver ICs 70a and 70b (FIG. 6) will not detrimentally affect the operations and life expectancy of the VCSEL array 60 (FIG. 6).

Figure 7:
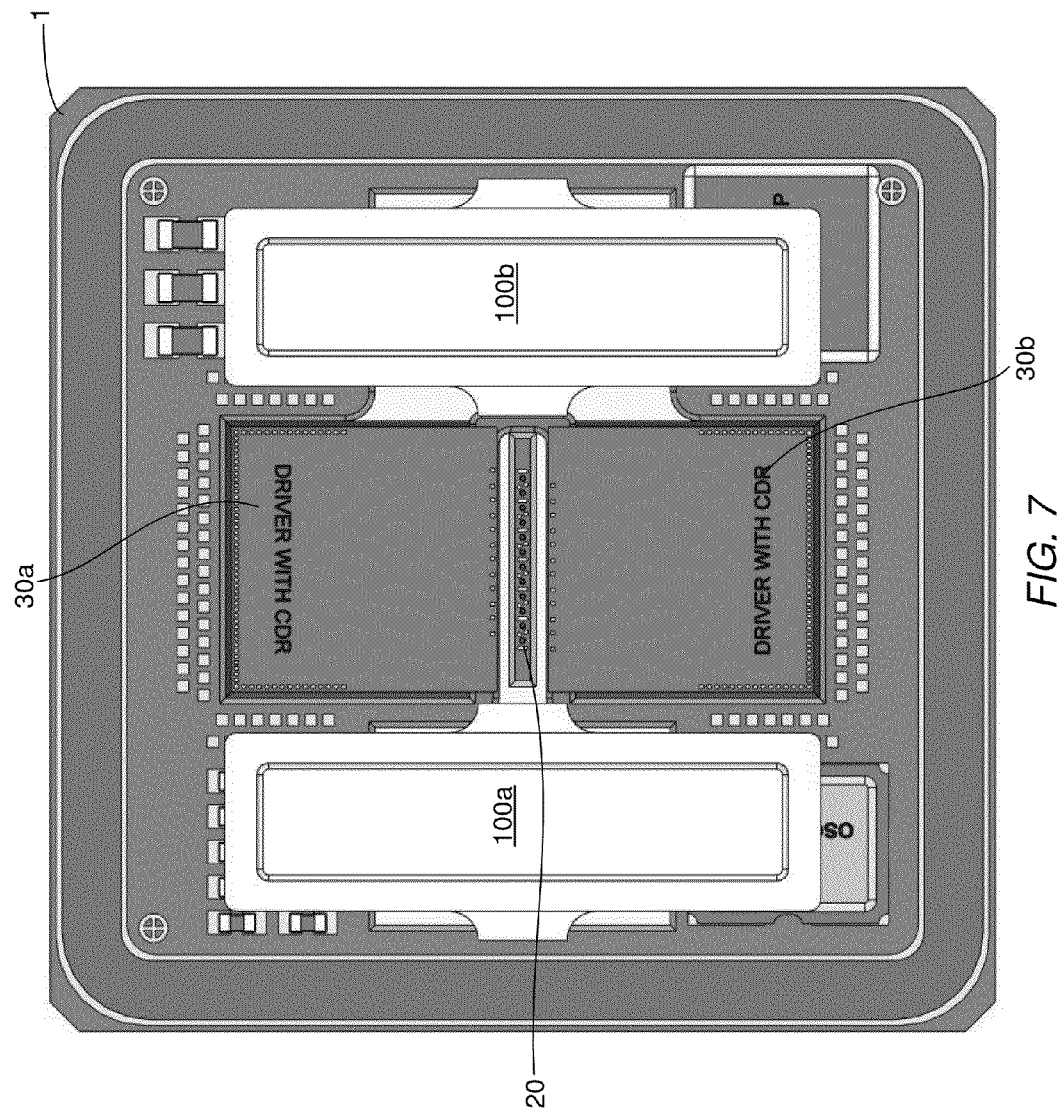
FIG. 7 illustrates a top plan view of the populated PCB shown in FIG. 3 having first and second heat dissipation blocks mounted on it.

FIG. 7 illustrates a top plan view of the populated PCB 1 shown in FIG. 3 having first and second heat dissipation blocks 100a and 100b mounted on it. The heat dissipation blocks 100a and 100b are made of a material that has a very high thermal conductivity, such as, for example, copper. The bottom surface of heat dissipation block 100a is in contact with portion 10a (FIGS. 2 and 3) of the heat dissipation layer 10. Heat generated by the VCSEL array 20 (FIG. 3) that is transferred into portion 10a (FIGS. 2 and 3) is subsequently transferred into heat dissipation block 100a. The bottom surface of heat dissipation block 100b is in contact with portion 10c (FIGS. 2 and 3) of the heat dissipation layer 10. Heat that is generated by the VCSEL driver ICs 30a and 30b (FIG. 3) and transferred into portion 10c (FIGS. 2 and 3) is subsequently transferred into heat dissipation block 100b. As will be described below in more detail with reference to FIGS. 9-13, a heat dissipation structure that is external to the module is thermally coupled to blocks 100a and 100b for transferring heat away from the module.

Figure 8:
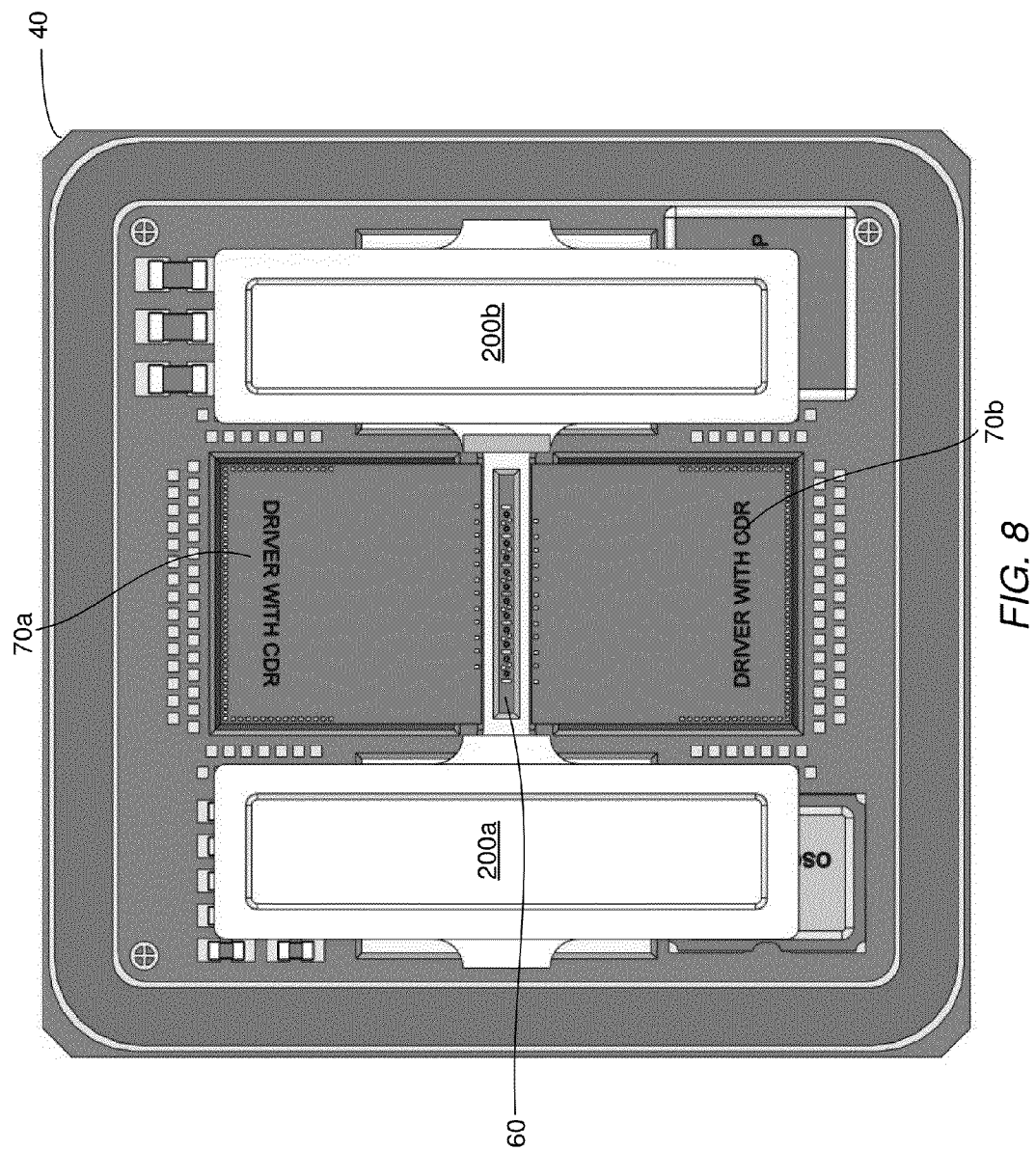
FIG. 8 illustrates a top plan view of the populated PCB shown in FIG. 6 having first and second heat dissipation blocks mounted on it.

FIG. 8 illustrates a top plan view of the populated PCB 40 shown in FIG. 6 having first and second heat dissipation blocks 200a and 200b mounted on it. The heat dissipation blocks 200a and 200b are made of a material that has a very high thermal conductivity, such as, for example, copper. The bottom surface of heat dissipation block 200a is in contact with portion 50c (FIGS. 5 and 6) of the heat dissipation layer 50. The bottom surface of heat dissipation block 200b is in contact with portion 50d (FIGS. 5 and 6) of the heat dissipation layer 50. Heat generated by the VCSEL array 60 (FIG. 6) that is transferred into portions 50c and 50d (FIGS. 5 and 6) is subsequently transferred into heat dissipation blocks 200a and 200b. As will be described below in more detail with reference to FIGS. 9-13, a heat dissipation structure that is external to the module is thermally coupled to blocks 200a and 200b for transferring heat away from the module.

Figure 9:
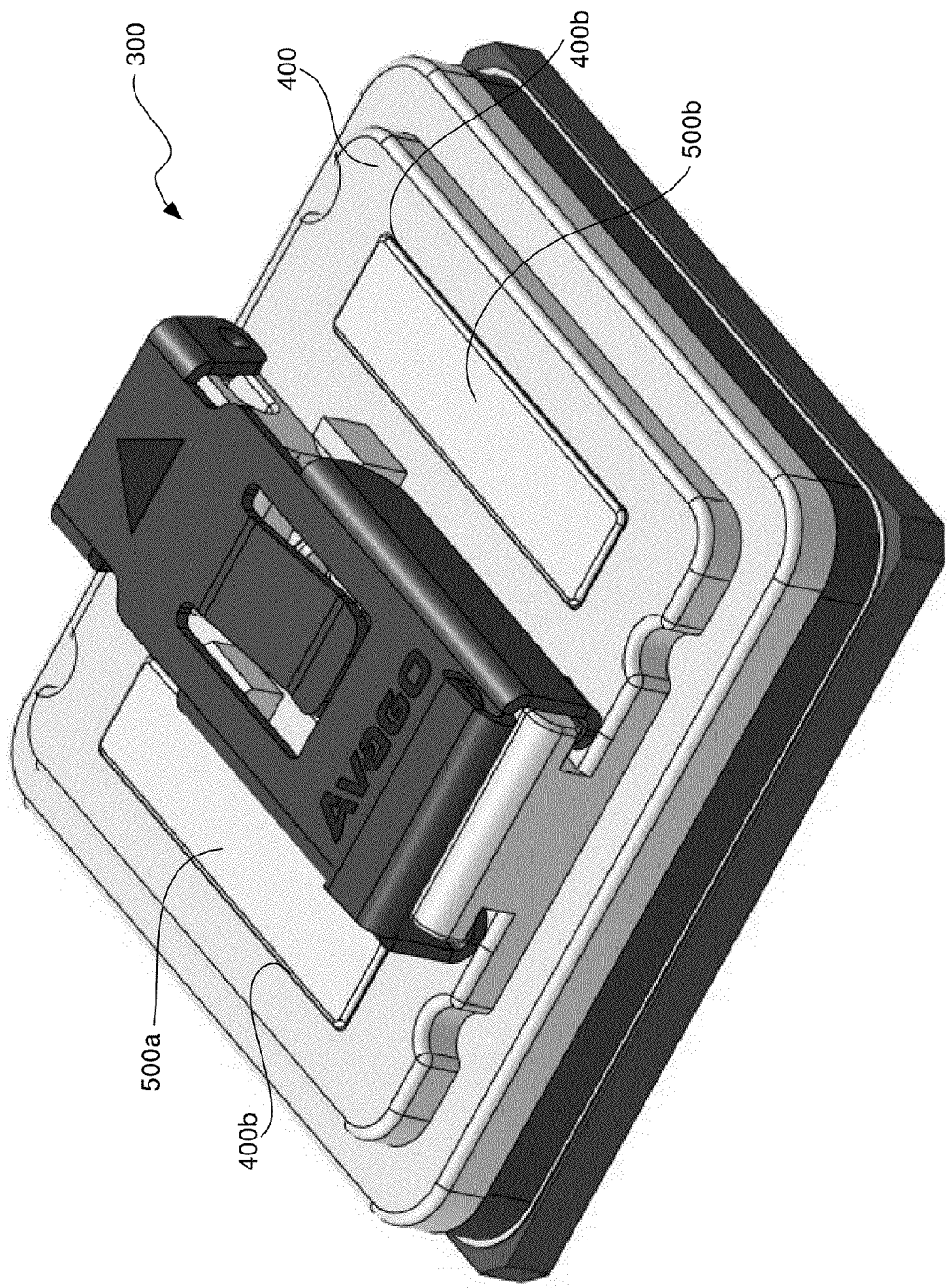
FIG. 9 illustrates a top perspective view of a parallel optical communications module that includes either the PCB and heat dissipation blocks shown in FIG. 7 or the PCB and heat dissipation blocks shown in FIG. 8.

FIG. 9 illustrates a top perspective view of a parallel optical communications module 300 that includes either the PCB 1 and heat dissipation blocks 100a and 100b shown in FIG. 7 or the PCB 40 and heat dissipation blocks 200a and 200b shown in FIG. 8. The module 300 also includes a cover 400 that is made of a plastic material such as ULTEM polyetherimide, for example. The heat dissipation blocks are referenced in FIG. 9 by reference numerals 500a and 500b. Once covered with the cover 400, the module 300 will look the same regardless of whether the populated PCB 1 shown in FIG. 7 or the populated PCB 40 shown in FIG. 8 is used in the module 300. For this reason, the heat dissipation blocks 500a and 500b could correspond to the heat dissipation blocks 100a and 100b, respectively, shown in FIG. 7 or the heat dissipation blocks 200a and 200b, respectively, shown in FIG. 8. The cover 400 has openings 400a and 400b formed therein through which top portions of the heat dissipation blocks 500a and 500b, respectively, protrude.

Figure 10:
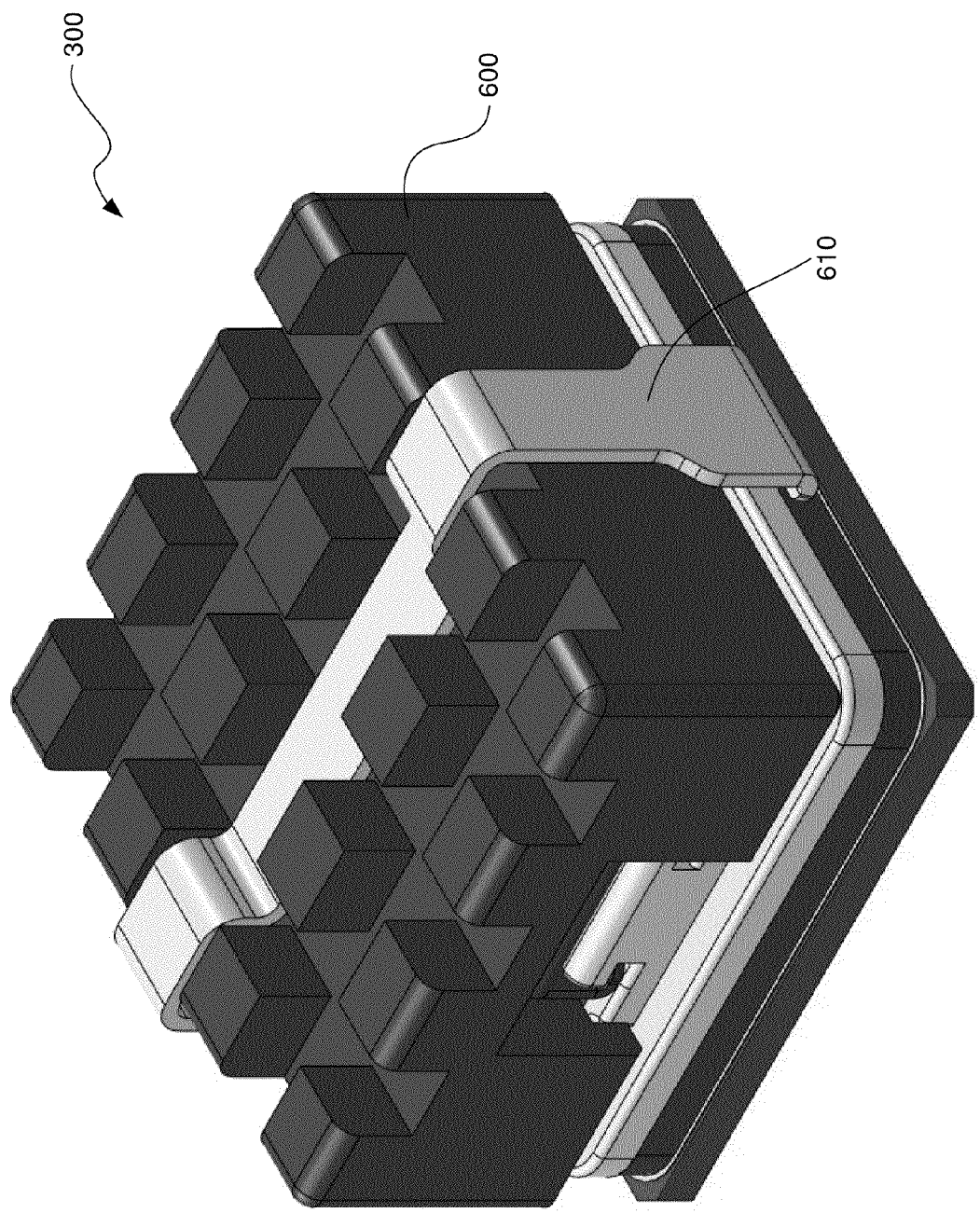
FIG. 10 illustrates a top perspective view of the module shown in FIG. 9 with a first configuration of an external dissipation structure secured thereto by a clip.
Figure 11:
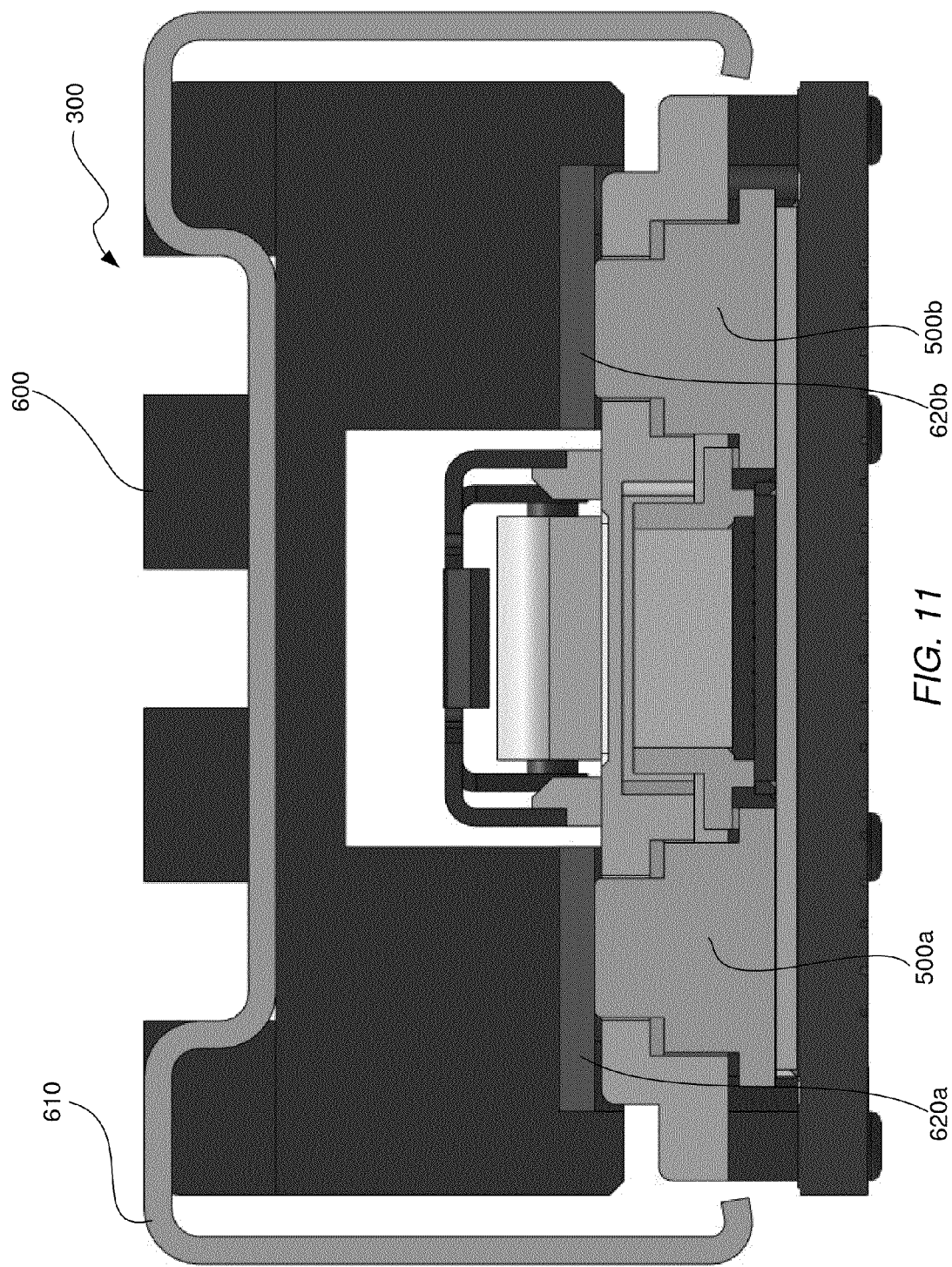
FIG. 11 illustrates a cross-sectional side view of the module, the external heat dissipation structure and the clip shown in FIG. 10.
Figure 12:
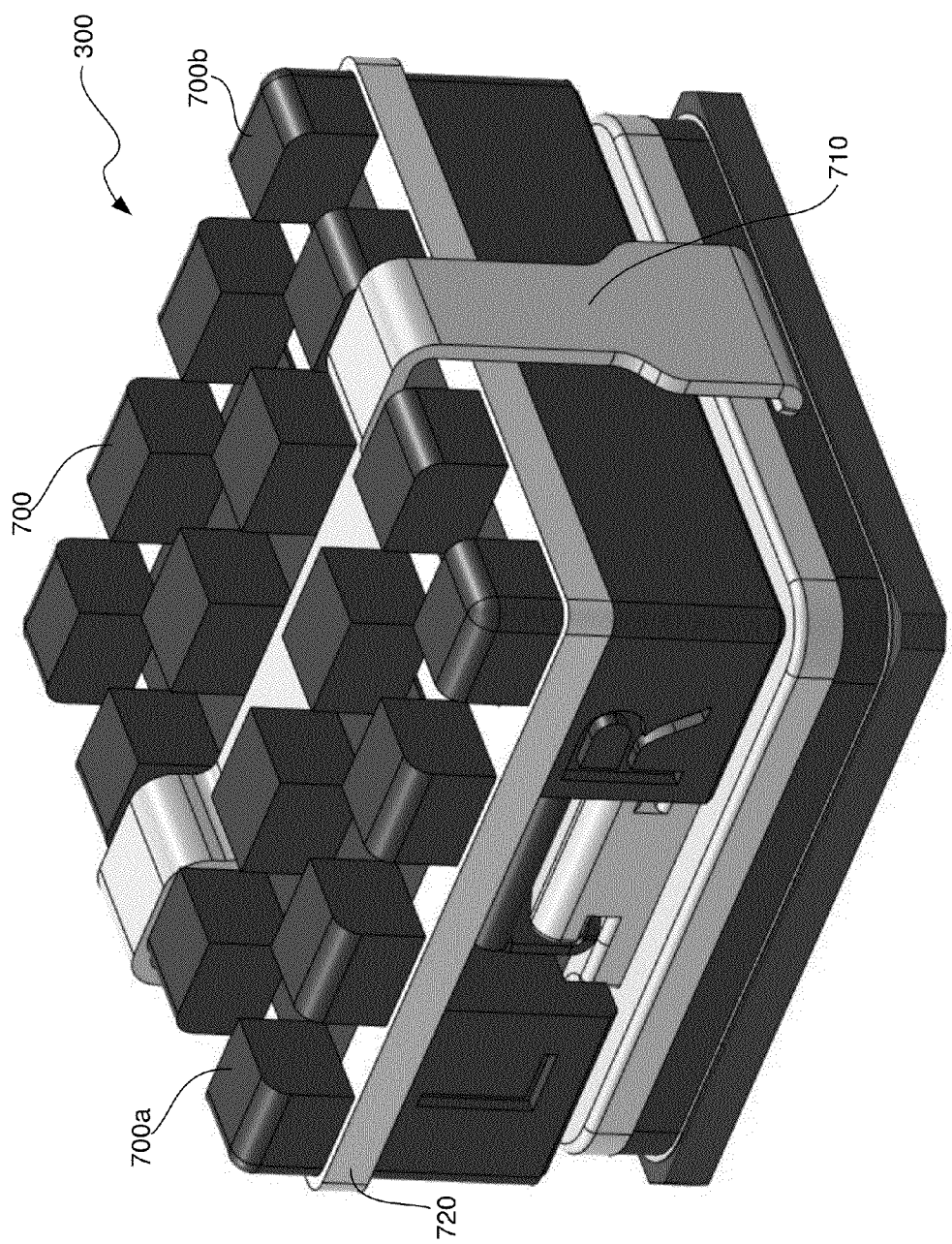
FIG. 12 illustrates a top perspective view of the module shown in FIG. 9 with a second configuration of an external dissipation structure secured thereto by a clip.
Figure 13:
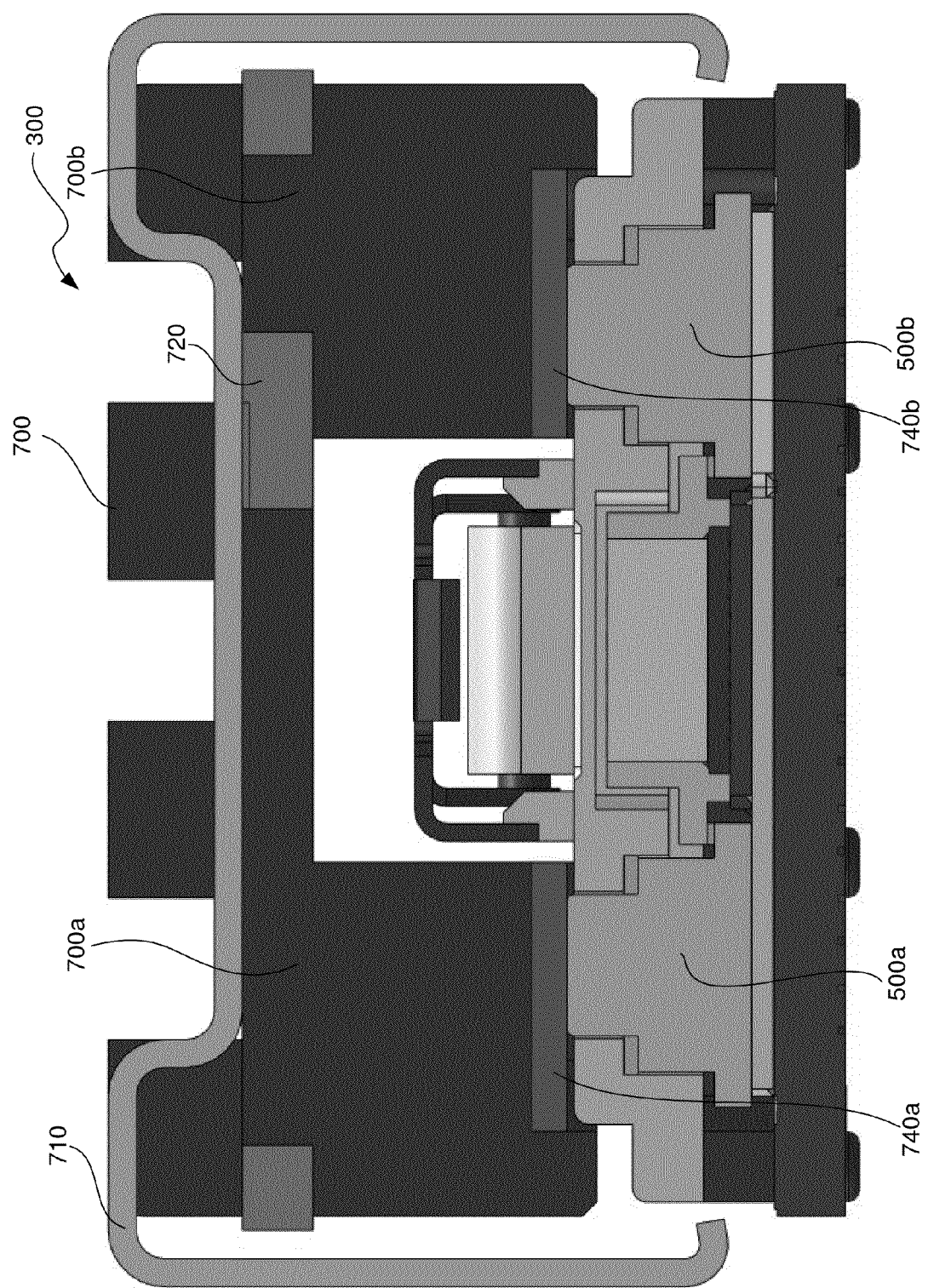
FIG. 13 illustrates a cross-sectional side view of the module, the external heat dissipation structure and the clip shown in FIG. 12.

FIG. 10 illustrates a top perspective view of the module 300 shown in FIG. 9 with a first configuration of an external dissipation structure 600 secured thereto by a clip 610. FIG. 11 illustrates a cross-sectional side view of the module 300, the external heat dissipation structure 600 and the clip 610 shown in FIG. 10. FIG. 12 illustrates a top perspective view of the module 300 shown in FIG. 9 with a second configuration of an external dissipation structure 700 secured thereto by a clip 710. FIG. 13 illustrates a cross-sectional side view of the module 300, the external heat dissipation structure 700 and the clip 710 shown in FIG. 12.

With reference to FIGS. 9-11, the first configuration of the external heat dissipation structure 600 (FIGS. 10 and 11) is a unitary die-cast part that is secured to the module 300 by the clip 610. The external heat dissipation structure 600 is mechanically and thermally coupled to the heat dissipation blocks 500a and 500b by thermal gap pads 620a and 620b (FIG. 11), respectively. The heat that is transferred into the heat dissipation blocks 500a and 500b (FIGS. 9 and 11) is then transferred through the thermal gap pads 620a and 620b into the external heat dissipation structure 600 where it is absorbed.

With reference to FIGS. 9, 12 and 13, the second configuration of the external heat dissipation structure 700 includes a plastic frame 720 that divides the structure 700 into at least first and second external heat dissipation structures 700a and 700b. The first external heat dissipation structure 700a is mechanically and thermally coupled to the heat dissipation block 500a by thermal gap pad 740a. The second external heat dissipation structure 700b is mechanically and thermally coupled to the heat dissipation block 500b by thermal gap pad 740b. The heat that is transferred into the heat dissipation block 500a (FIGS. 9 and 13) is then transferred through the thermal gap pad 740a into the first external heat dissipation structure 700a where it is absorbed. The heat that is transferred into the heat dissipation block 500b (FIGS. 9 and 13) is then transferred through the thermal gap pad 740b into the second external heat dissipation structure 700b where it is absorbed. Dividing the external heat dissipation structure 700 into the first and second external heat dissipation structures 700a and 700b further decouples the thermal paths, which provides advantages similar to those provided by decoupling the thermal paths within the module 300.

It can be seen from the foregoing description that embodiments of the invention include developing a heat dissipation strategy for an optical communications module based on the temperature sensitivities of heat-producing components of the module and the heat dissipation resources that are available for use in the module. A heat dissipation system that allocates heat dissipation resources in a manner that is consistent with that strategy is then deployed in the module. In addition, thermal decoupling of thermal pathways is used to further improve heat dissipation.

It should be noted that the invention has been described with respect to illustrative embodiments for the purpose of describing the principles and concepts of the invention. The invention is not limited to these embodiments. For example, while the invention has been described with reference to use in parallel optical communications modules, the invention may be used in any optical communications module in which different components have different temperature sensitivities and in which heat dissipation resources are limited. The invention has been described with reference to parallel optical communications modules due to the fact that the increased number of channels and components and the increased demand for smaller module sizes gives rise to more stringent heat dissipation requirements. As will be understood by those skilled in the art in view of the description being provided herein, many modifications may be made to the embodiments described herein while still achieving the goals of the invention, and all such modifications are within the scope of the invention.

What is claimed is:

1. An optical communications module comprising:
    a circuit board having a metal pattern thereon;
    a heat dissipation layer covering separate areas of the metal pattern, the heat dissipation layer comprising a layer of thermally-conductive material, a first area of the heat dissipation layer extending between opposed portions of a second area of the heat dissipation layer;
    at least a first optoelectronic component disposed on a first portion of the first area of the heat dissipation layer, wherein at least some heat that is generated by the first optoelectronic component flows into the first portion of the heat dissipation layer; and
    at least a first integrated circuit (IC) disposed on at least one of the opposed portions of the second area of the heat dissipation layer, wherein at least some heat that is generated by the first IC flows into the at least one of the opposed portions of the second area of the heat dissipation layer, and wherein the first and second areas of the heat dissipation layer are thermally decoupled from one another.

2. The optical communications module of claim 1, further comprising:
    at least a second IC disposed on a remaining one of the opposed portions of the second area of the heat dissipation layer, wherein at least some heat that is generated by the second IC flows into the remaining one of the opposed portions of the second area of the heat dissipation layer.

3. The optical communications module of claim 2, wherein the first area of the heat dissipation layer includes a second portion that is connected to the first portion wherein at least some of the heat that flows into the first portion flows along a first thermal path from the first portion into the second portion and wherein the second area of the heat dissipation layer includes a third portion that connects the opposed portions wherein at least some of the heat that flows into the opposed portions of the second area flows along a second thermal path towards the third portion.

4. The optical communications module of claim 3, further comprising:
    a first heat dissipation block disposed on the second portion such that a bottom surface of the first heat dissipation block is thermally coupled to the second portion, the first heat dissipation block being made of a material of relatively high thermal conductivity, and wherein at least some of the heat that flows into the second portion flows into the first heat dissipation block; and
    a second heat dissipation block disposed on the third portion such that a bottom surface of the second heat dissipation block is thermally coupled to the third portion, the second heat dissipation block being made of a material of relatively high thermal conductivity, and wherein at least some of the heat that flows into the third portion flows into the second heat dissipation block.

5. The optical communications module of claim 4, further comprising:
an external heat dissipation structure having one or more surfaces that are thermally coupled to the first and second heat dissipation blocks, and wherein at least some of the heat that flows into the first and second heat dissipation blocks flows into the external heat dissipation structure.

6. The optical communications module of claim 5, wherein the external heat dissipation structure is divided into first and second external heat dissipation structures that are thermally decoupled from one another, and wherein at least some of the heat that flows into the first heat dissipation block flows into the first external heat dissipation structure, and wherein at least some of the heat that flows into the second heat dissipation block flows into the second external heat dissipation structure.

7. The optical communications module of claim 3, wherein the thermal decoupling of the first and third portions of the heat dissipation layer from one another is due at least in part to a physical separation between the first and third portions of the heat dissipation layer.

8. The optical communications module of claim 7, wherein the thermal decoupling of the first and third portions of the heat dissipation layer from one another is due at least in part to a physical separation between the portions of the metal pattern on which the first and third portions of the heat dissipation layer are disposed.

9. The optical communications module of claim 3, wherein the thermal decoupling of the first thermal path from the second thermal path is due at least in part to a physical separation between the second and third portions of the heat dissipation layer.

10. The optical communications module of claim 9, wherein the thermal decoupling of the first thermal path from the second thermal path is due at least in part to a physical separation between the portions of the metal pattern on which the second and third portions of the heat dissipation layer are disposed.

11. The optical communications module of claim 2, wherein the heat dissipation layer includes a third portion that connects the opposed portions.

12. The optical communications module of claim 11, further comprising:
a first heat dissipation block disposed on a second portion of the first area of the heat dissipation layer such that a bottom surface of the first heat dissipation block is thermally coupled to the second portion, the first heat dissipation block being made of a material of relatively high thermal conductivity, and wherein at least some of the heat that flows into the second portion flows into the first heat dissipation block; and
a second heat dissipation block disposed on the third portion such that a bottom surface of the second heat dissipation block is thermally coupled to the third portion, the second heat dissipation block being made of a material of relatively high thermal conductivity, and wherein at least some of the heat that flows into the third portion flows into the second heat dissipation block.

13. The optical communications module of claim 12, further comprising:
an external heat dissipation structure having one or more surfaces that are thermally coupled to the first and second heat dissipation blocks, and wherein at least some of the heat that flows into the first and second heat dissipation blocks flows into the external heat dissipation structure.

14. The optical communications module of claim 13, wherein the external heat dissipation structure is divided into first and second external heat dissipation structures that are thermally decoupled from one another, and wherein at least some of the heat that flows into the first heat dissipation block flows into the first external heat dissipation structure, and wherein at least some of the heat that flows into the second heat dissipation block flows into the second external heat dissipation structure.

15. The optical communications module of claim 1, wherein the thermal decoupling of the first and second areas of the heat dissipation layer from one another is due at least in part to a physical separation between the first and second areas of the heat dissipation layer.

16. The optical communications module of claim 15, wherein the thermal decoupling of the first and second areas of the heat dissipation layer from one another is due at least in part to a physical separation between the portions of the metal pattern on which the first and second areas of the heat dissipation layer are disposed.

17. An optical communications module comprising:
a circuit board having a metal pattern thereon;
a heat dissipation layer disposed over portions of the metal pattern, the heat dissipation layer comprising a layer of thermally-conductive material;
at least a first optoelectronic component disposed on a first portion of the heat dissipation layer, wherein at least some heat that is generated by the first optoelectronic component flows into the first portion of the heat dissipation layer;
at least a first integrated circuit (IC) disposed on a second portion of the heat dissipation layer, wherein at least some heat that is generated by the first IC flows into the second portion of the heat dissipation layer, and wherein the first and second portions of the heat dissipation layer are physically separated and thermally decoupled from one another and wherein the portions of the metal pattern on which the first and second portions of the heat dissipation layer are disposed are physically separated from one another; and
at least a first heat dissipation structure mechanically and thermally coupled to at least one of the first and second portions of the heat dissipation layer for thermally coupling heat from the optical communications module to an external heat dissipation structure.

18. The optical communications module of claim 17, further comprising:
a second integrated circuit disposed on the second portion, wherein the first portion of the heat dissipation layer generates a first thermal path and the second portion of the heat dissipation layer generates a second thermal path and a third thermal path, the first thermal path conducting heat along the heat dissipation layer from the optoelectronic component, the second and third thermal paths conducting heat along the heat dissipation layer from the first integrated circuit and the second integrated circuit, respectively.

19. An optical communications module comprising:
a circuit board having a metal pattern thereon;
a heat dissipation layer disposed over a first portion, a second portion, and a third portion of the metal pattern, the heat dissipation layer comprising a layer of thermally-conductive material;

at least a first optoelectronic component disposed on a first portion of the heat dissipation layer, the first portion having opposed first and second areas, wherein at least some heat that is generated by the first optoelectronic component flows into the opposed first and second areas of the first portion of the heat dissipation layer;

at least a first integrated circuit (IC) disposed on a second portion of the heat dissipation layer, the second portion located adjacent to the first portion of the heat dissipation layer, wherein at least some heat that is generated by the first IC flows into the second portion of the heat dissipation layer, and wherein the first and second portions of the heat dissipation layer are physically separated and thermally decoupled from one another and wherein the portions of the metal pattern on which the first and second portions of the heat dissipation layer are disposed are physically separated from one another; and at least a first heat dissipation structure mechanically and thermally coupled to the first portion of the heat dissipation layer for thermally coupling heat from the optical communications module to an external heat dissipation structure.

20. The optical communications module of claim 19, further comprising:

a second integrated circuit disposed on a third portion of the heat dissipation layer opposed to the second portion of the heat dissipation layer, the third portion physically separated and thermally decoupled from the first portion and the second portion, wherein the first portion of the heat dissipation layer generates a first thermal path and a second thermal path, the first and second thermal paths conducting heat in opposite directions along the heat dissipation layer from the first optoelectronic component.

* * * * *